United States Patent [19]
Jang

[11] Patent Number: 5,583,466
[45] Date of Patent: Dec. 10, 1996

[54] REFERENCE OSCILLATOR CONTROLLING DEVICE IN VERY SMALL APERTURE TERMINAL

[75] Inventor: Yong J. Jang, Kyoungki-do, Rep. of Korea

[73] Assignee: Hyundai Electronics Co., Ltd., Kyoungki-Do, Rep. of Korea

[21] Appl. No.: 456,473

[22] Filed: Jun. 1, 1995

[30] Foreign Application Priority Data

Jun. 30, 1994 [KR] Rep. of Korea ................... 94-15640

[51] Int. Cl.$^6$ ................................................ H03L 7/085
[52] U.S. Cl. ......................... 331/1 A; 331/17; 331/25
[58] Field of Search ........................ 331/1 A, 17, 25

[56] References Cited

U.S. PATENT DOCUMENTS

| | | | |
|---|---|---|---|
| 4,151,485 | 4/1979 | LaFratta | 331/1 A |
| 4,456,890 | 6/1984 | Carickhoff | 331/1 A |
| 4,864,253 | 9/1989 | Zwack | 331/2 |
| 5,271,039 | 12/1993 | Suzuki | 375/81 |
| 5,459,435 | 10/1995 | Taki | 331/25 |

*Primary Examiner*—Siegfried H. Grimm
*Attorney, Agent, or Firm*—Fish & Richardson, P.C.

[57] ABSTRACT

A reference oscillator controlling device in a Very Small Aperture Terminal (VSAT) for low speed data makes a relatively unstable reference oscillator into a precise reference oscillator by synchronizing the reference oscillator with a clock extracted from a data stream which is generated by a precise reference oscillator in a district center of the VSAT.

4 Claims, 2 Drawing Sheets

REFERENCE OSCILLATOR CONTROLLING DEVICE IN VERY SMALL APERTURE TERMINAL

BACKGROUND OF THE INVENTION

The present invention relates to a reference oscillator controlling device in a very small aperture terminal (VSAT), and more particularly to a reference oscillator controlling device in a VSAT which makes a relatively unstable reference oscillator a precise reference oscillator by synchronizing a reference oscillator of the VSAT with a clock extracted from a data stream which is generated by a precise reference oscillator in a host station of a VSAT.

Generally, a VSAT transmits data in a burst manner via satellite to a host station, and to receive the data of a burst manner in the host station, the transmission frequency from the local station must be exactly stable. For the stable frequency in the local station, an oscillator having a high stability is required, and so, a stable and precise reference oscillator of high price is currently used in the local station. However, there remains a burden of the cost in establishing a VSAT due to the high price of such a precise reference oscillator.

On the other hand, one of the techniques for controlling a reference oscillation frequency in a communication system between a host station and local station, such as the VSAT system, is disclosed in U.S. Pat. No. 5,271,039. The disclosed technique is about a local oscillating portion and BPSK demodulating portion for making a local oscillation frequency stable during the modulation/demodulation for sending/receiving, and the stability of the frequency is achieved by generating phase difference information through a controller and generating a symbol clock through an A/D converter and a DSP by an IF.

Thus, the above technique is employed for maintaining a stable frequency by the feedback of the phase difference information of a control circuit as a local oscillation control signal, and for simplifying the structure of a circuit. Accordingly, the technique cannot be applied to actuate an unstable reference oscillator with precision.

SUMMARY OF THE INVENTION

To solve the above problems, it is an object of the present invention to provide a reference oscillator controlling device which makes a relatively unstable and low-priced reference oscillator precise and stable, by synchronizing a reference oscillator of a Very Small Aperture Terminal (VSAT) with a clock extracted from a data stream which is generated by a precise reference oscillator in a district center of a VSAT in transmitting the data stream generated by the precise reference oscillator in the district center. Thus the cost required in constructing a local center is reduced.

Accordingly, there is provided a reference oscillator control device in a Very Small Aperture Terminal, comprising: a digital frequency comparing portion for comparing the frequencies of two input clocks for a particular long period to produce a parallel digital data word in proportion to the frequency difference between two input clocks; an automatic frequency controlling portion for continuously modifying the frequency of a reference oscillator and outputting the modified frequency to synchronize the output frequency of the reference oscillator with a clock restored from a data stream generated by a precise reference oscillator; a digital-analog converter for converting a digital signal output from the automatic frequency controller into an analog signal; and a reference oscillating portion for converting an oscillating frequency according to the output of the automatic frequency controller and for providing the converted frequency to each portion.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
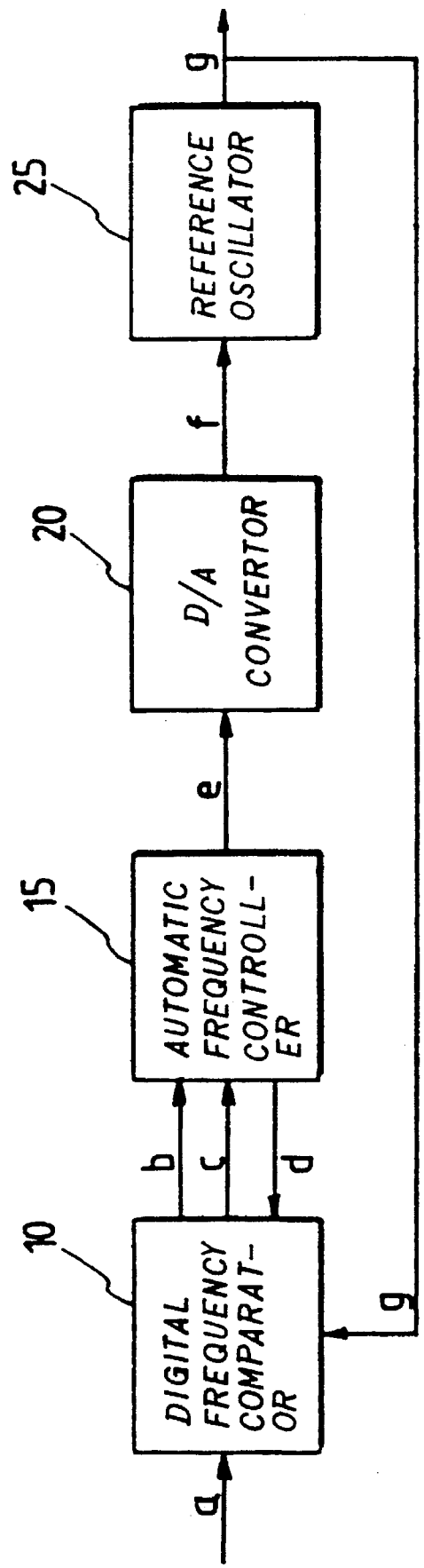
FIG. 1 is a block diagram illustrating a reference oscillator controller of a very small aperture terminal for low speed data according to the present invention.

Referring to the drawings, an embodiment of the present invention is expounded in detail.

FIG. 1 is a block diagram showing a reference oscillator controller of a Very Small Aperture Terminal (VSAT) according to the present invention. The reference oscillator controller is composed of digital frequency comparator 10 for comparing the frequencies of two input clocks a and g for a particular long period to produce a parallel digital data word e in proportion to the frequency difference between the two input clocks a and g, automatic frequency controller 15 for continuously modifying the frequency of reference oscillator 25 and outputting the modified frequency to synchronize the output frequency g of reference oscillator 25 and clock a restored from a data stream generated by a precise reference oscillator, digital analog converter 20 for converting digital signal e output from automatic frequency controller 15 into an analog signal, and reference oscillator 25 for converting an oscillating frequency according to the output e of automatic frequency controller 15 and for providing the converted frequency to each portion.

Figure 2:
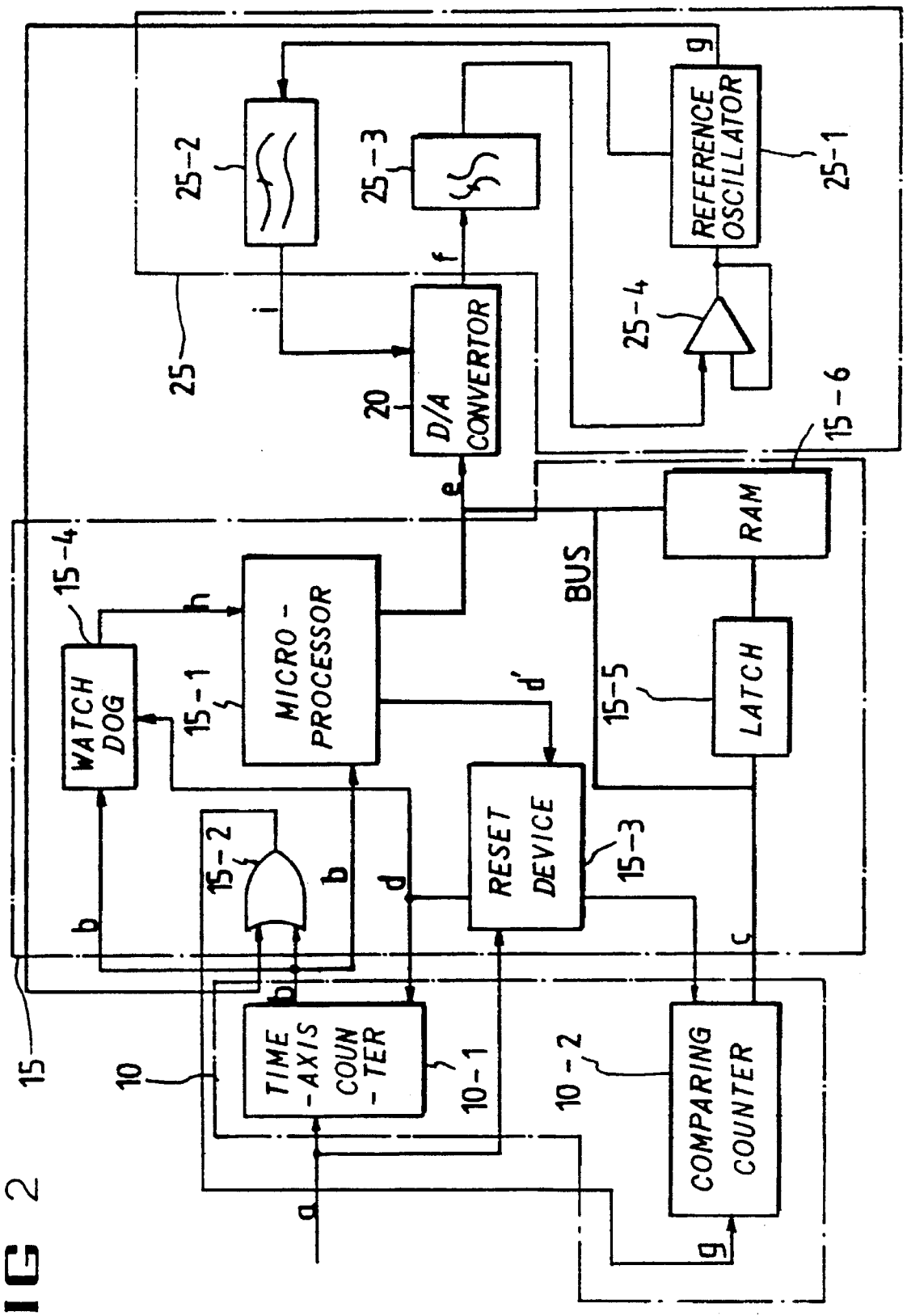
FIG. 2 is a block diagram illustrating a reference oscillator controller in detail.

Also, the detailed block diagram of each portion is shown on FIG. 2. Here, digital frequency comparator 10 consists of a time-axis counter 10-1 for defining a time to count in a comparison counter 10-2 by receiving the clock a restored from a data stream and a comparison counter 10-2 for counting the clock g output from reference oscillator 25-1 during the time defined in the time-axis counter 10-1.

The aforesaid automatic frequency controller 15 is composed of microprocessor 15-1 for clearing the two counters 10-1 and 10-2 by receiving the interrupt output from time-axis counter 10-1, enabling again the counters 10-1 and 10-2, reading out frequency error value c from RAM 15-6, converting the read out value into reference oscillator 25-1 control data e, and outputting the converted data, OR gate 15-2 for adding a signal b output from time-axis counter 10-1 and the clock g output from reference oscillator 25-1 and controlling the counting of reference counter 10-2 to halt when a signal goes 'high', reset device 15-3 for receiving clear signal d' output from microprocessor 15-1, and outputting reset signal d to time-axis counter 10-1, comparison counter 10-2 and watch-dog 15-4, respectively. The automatic frequency controller also includes watch-dog 15-4 for resetting microprocessor 15-1 driven according to the output b of time-axis counter 10-1 to prevent microprocessor 15-1 from non-operating, and RAM 15-6 for receiving value c output from comparison counter 10-2 via latch 15-5 and storing the received value.

Reference oscillator 25 is composed of voltage controlled oscillator 25-1, low-pass filters 25-2 and 25-3 for passing the low frequency part of an input signal, which is low-attenuated, and buffer 25-4 for buffering.

In the operation of the present invention, digital frequency comparator 10, being composed of two binary-synchronous counters 10-1 and 10-2, is driven by the different clocks a and g. Each counter 10-1 and 10-2 is reset by a clear signal d' input from microprocessor 15-1 of automatic frequency controller 15. Here, clear signal d' is input as reset signal d via reset device 15-3 to enhance the accuracy of frequency comparison. The reset signal d is input at the time of the edge occurrence of clock a which is restored from the data stream by reset device 15-3. Time-axis counter 10-1 is driven by clock a restored from the data stream, and outputs a rising edge at a particular time desired after clear signal d' is eliminated. The period of the rising-edge output can be varied according to the stability of reference oscillator 25-1, however, the period in the present invention is about 15 seconds.

Signal b, output from time-axis counter 10-1, is input to OR gate 15-2 and added to the signal g output from reference oscillator 25-1 so that the added signal is input to comparison counter 10-2. When signal g is input in a 'high' state and keeps the state for a particular time period, comparison counter 10-2 immediately halts counting and simultaneously signal b, outputted from time-axis counter 10-1, is applied to microprocessor 15-1 so that microprocessor 15-1 is interrupted. Also, comparison counter 10-2 is driven by signal g output from reference oscillator 25-1 via OR gate 15-2. If clock a restored from the data stream and the output signal g are completely synchronized, an overflow to zero occurs when the output of time-axis counter 10-1 goes 'high.' If clock a and output signal g are not synchronized, the output value of comparison counter 10-2 becomes a binary complement in direct proportion to the difference between the frequencies of the two clocks.

When microprocessor 15-1 of automatic frequency controller 15 is interrupted through digital frequency comparator 10, microprocessor 15-1 clears and enables the two counters 10-1 and 10-2, and simultaneously, reads out frequency error value c which is output from comparison counter 10-2 and stored in RAM 15-6 via latch 15-5. Microprocessor 15-1 performing the above action is a small microprocessor of a 80C39 CPU, and is driven by output g of reference oscillator 25-1. Data c, which indicates frequency error, is read out by microprocessor 15-1, and then converted into data e for controlling reference oscillator 25-1. Thus, data e is input serially to D/A converter 20. Also, watch-dog 15-4 is provided for receiving output b of time-axis counter 10-1 and outputting reset signal h to microprocessor 15-1 in order to prevent the microprocessor 15-1 from non-operating. The watchdog 15-4 is for resetting microprocessor 15-1 by regarding that an error occurred when time-axis counter 10-1 is not cleared by microprocessor 15-1 between 'high' states. Frequency error value c is transferred from comparison counter 10-2 to parallel data bus linked to microprocessor 15-1.

When control data word e for controlling reference oscillator 25-1 is input to D/A converter 20 via automatic frequency controller 15, D/A converter 20 converts the input control data word e into an analog signal, and then the converted signal f, being converted into an analog signal, is input to reference oscillator 25-1 via low-pass filter 25-3 and buffer 25-4. Here, the reference voltage i used for D/A converter 20 is provided from reference oscillator 25-1 via low-pass filter 25-2 to prevent an abrupt voltage shift. Also, as reference oscillator 25-1, a voltage controlled crystal oscillator (VCXO) which is relatively stable, is employed, and output g, being returned via OR gate 15-2 as a clock for comparison counter 10-2, continues to perform synchronization.

As described above, the present invention has the effect of reducing the cost for constructing a local station system by using a reference oscillator of low-price, but relatively stable, instead of that of a high-priced, but precise reference oscillator, used in a conventional local station and performing the same function.

What is claimed is:

1. A reference oscillator controlling device in a Very Small Aperture Terminal, comprising:

a digital frequency comparing portion which compares the frequencies of two input clocks for a particular period to produce a difference signal representative of the frequency difference between the two input clocks, one of the two input clocks being restored from a data stream generated by a reference oscillator;

an automatic frequency controlling portion which receives the difference signal and provides a parallel digital data word in proportion to the frequency difference between the two input clocks in order to synchronize the frequency of an output signal of the reference oscillator controlling device with the frequency of said one of the two input clocks;

a digital-analog converter which converts the parallel digital data word from said automatic frequency controlling portion into an analog signal; and a reference oscillating portion which generates said output signal and controls the frequency of the output signal according to the analog signal and provides the output signal as the other of said two input clocks to said digital frequency comparing portion.

2. A reference oscillator controlling device in a Very Small Aperture Terminal described in claim 1, wherein said digital frequency comparing portion comprises a time-axis counter which receives said one of said two input clocks and defines a time for counting; and a comparison counter which counts said other of said two input clocks during the time defined in said time-axis counter.

3. A reference oscillator controlling device in a Very Small Aperture Terminal described in claim 1, wherein said digital frequency comparing portion comprises a time-axis counter and a comparison counter, wherein said automatic frequency controlling portion comprises a microprocessor which clears both the time-axis counter and the comparison counter upon receiving an interrupt output from the time-axis counter, said microprocessor converting a read-out value to reference oscillator control data and outputting the converted data;

said automatic frequency controlling portion comprising an OR gate which adds a signal output from the time-axis counter and said other of said two input clocks, and then controls the counting of the comparison counter which is halted when a signal goes 'high';

a watch-dog which receives the output of the time-axis counter and resets said microprocessor in order to prevent the non-operation of said microprocessor;

a reset device which receives a clear signal output from said microprocessor, and outputs a reset signal to the time-axis counter, the comparison counter and the watch-dog, respectively; and a RAM for receiving a value output from the comparison counter via a latch, and for storing the received value, said microprocessor enabling the time-axis and comparison counters to read out a frequency error value from the RAM.

4. A reference oscillator controlling device in a Very Small Aperture Terminal described in claim 1, wherein said reference oscillating portion comprises a voltage-controlled oscillator, a low-pass filter which passes the low-frequency-part among said analog signal with low-attenuation, and a buffer for buffering the filtered analog signal and applying it to a control input of said voltage-controlled oscillator.

\* \* \* \* \*